United States Patent
Laske et al.

(10) Patent No.: US 8,352,886 B2
(45) Date of Patent: Jan. 8, 2013

(54) METHOD FOR THE REPRODUCIBLE DETERMINATION OF THE POSITION OF STRUCTURES ON A MASK WITH A PELLICLE FRAME

(75) Inventors: Frank Laske, Weilmuenster (DE); Christian Enkrich, Waldbronn (DE); Eric Cotte, Dresden (DE)

(73) Assignee: KLA-Tencor MIE GmbH, Weilburg (DE)

( * ) Notice: Subject to any disclaimer, the term of this patent is extended or adjusted under 35 U.S.C. 154(b) by 21 days.

(21) Appl. No.: 13/030,665

(22) Filed: Feb. 18, 2011

(65) Prior Publication Data
US 2011/0225554 A1    Sep. 15, 2011

(30) Foreign Application Priority Data
Mar. 9, 2010   (DE) .......................... 10 2010 015 884

(51) Int. Cl.
*G06F 17/50*   (2006.01)
*G06G 11/22*   (2006.01)
*G03F 1/00*    (2006.01)

(52) U.S. Cl. ............... 716/51; 716/50; 716/52; 716/53; 716/54; 716/55; 716/56; 430/5

(58) Field of Classification Search ............. 716/50–56, 716/136, 139; 700/121
See application file for complete search history.

(56) References Cited

U.S. PATENT DOCUMENTS

| | | | |
|---|---|---|---|
| 5,853,927 A | | 12/1998 | Huang |
| 6,498,685 B1 * | | 12/2002 | Johnson .................. 359/626 |
| 6,834,549 B2 * | | 12/2004 | Shu et al. .................. 73/768 |
| 6,883,158 B1 * | | 4/2005 | Sandstrom et al. ............. 430/5 |
| 7,444,616 B2 * | | 10/2008 | Sandstrom et al. ............. 716/53 |
| 7,476,474 B2 * | | 1/2009 | Ganguli et al. .................... 430/5 |
| 7,604,906 B1 * | | 10/2009 | Volk et al. ........................ 430/5 |
| 7,702,471 B2 * | | 4/2010 | Li et al. ........................... 702/40 |

(Continued)

FOREIGN PATENT DOCUMENTS
DE    10321680 B4    6/2008
(Continued)

OTHER PUBLICATIONS

Yasutaka et al.; "Characteristics optimization of mask materials for Hyper-NA lithography"; Publication Year: 2007; Mask and Lithography Conference (EMLC), 2007 23rd European; pp. 1-8.*
Eric Cotte et al., "193-nn Immersion Photomask Image Placement in Exposure Tools", Optical Microlithography XIX, Proc. of SPIE vol. 6154 61541F (2006).
Eric Cotte et al., "Pellicle Choice 93-nn Immersion Lithography Photomask", 24th Annual BACUS Symposium on Photomask Technology, SPIE vol. 5567 (SPIE, Bellingham, WA, 2004).

(Continued)

*Primary Examiner* — Helen Rossoshek
(74) *Attorney, Agent, or Firm* — Patentbar International, P.C.

(57) ABSTRACT

A method for the reproducible determination of the positions of structures (3) on a mask (2) is disclosed. A pellicle frame (30) is firmly attached to the mask (2). A theoretical model of the bending of the mask (2) with the firmly attached pellicle frame (30) is calculated, wherein material properties of the mask (2), of the pellicle frame (30), and of the attaching means between the pellicle frame (30) and the mask (2) are taken into account in the calculation of the bending of the mask (2). For the calculation of the bending of the mask (2) its contact with three support points is considered. The positions of the structures (3) on the mask (2) are measured with a metrology tool (1). The measured positions of each structure are corrected with the theoretical model of the bending of the mask at the position of the respectively measured structure.

9 Claims, 7 Drawing Sheets

U.S. PATENT DOCUMENTS

| | | | |
|---|---|---|---|
| 2004/0067424 A1* | 4/2004 | Schilz et al. | 430/5 |
| 2004/0194556 A1 | 10/2004 | Shu et al. | |
| 2006/0246234 A1* | 11/2006 | Meyers et al. | 428/14 |
| 2007/0292775 A1* | 12/2007 | Hamada | 430/5 |
| 2008/0094591 A1 | 4/2008 | Aschbach et al. | |
| 2010/0328635 A1* | 12/2010 | Sekihara | 355/30 |
| 2011/0101226 A1* | 5/2011 | Ben-Zvi et al. | 250/358.1 |
| 2011/0189440 A1* | 8/2011 | Appleby et al. | 428/156 |

FOREIGN PATENT DOCUMENTS

| | | |
|---|---|---|
| JP | 04133061 A | 5/1992 |
| JP | 05061187 A | 3/1993 |
| JP | 10073407 A | 3/1998 |
| JP | 2005292197 A | 10/2005 |
| WO | 2005103827 A1 | 4/2005 |

OTHER PUBLICATIONS

Carola Blaesing, "Pattern Placement Metrology for Mask Making", SEMI Your Industry Resource, Semicon Europa 98, Mar. 31, 1998.

German Examination Report from DE 10 2010 015 884.4-51 filed Mar. 9, 2010, mailed Nov. 18, 2010.

\* cited by examiner

METHOD FOR THE REPRODUCIBLE DETERMINATION OF THE POSITION OF STRUCTURES ON A MASK WITH A PELLICLE FRAME

RELATED APPLICATIONS

This Application claims priority of German Patent Application No. 10 2010 015 884.4, filed on Mar. 9, 2010, which is incorporated herein by reference in their entirety.

FIELD OF THE INVENTION

The present invention relates to a method for the reproducible determination of the position of structures on a mask. A pellicle-frame, about which a foil is tightly wrapped, covers the structures on the mask. The pellicle frame is firmly attached to the mask by an adhesive.

BACKGROUND OF THE INVENTION

A metrology tool for measuring the positions of structures on masks or substrates, respectively, used in the production of semiconductors, is disclosed in the presentation manuscript "Pattern Placement Metrology For Mask Making" by Dr. Carola Biasing. The presentation was given at the conference Semicon, Education Program, in Geneva on Mar. 31, 1998. In this presentation manuscript the fundamentals of a metrology tool are described in detail. For the details of operation and for the configuration of a metrology tool explicit reference to FIG. 1 of the patent application is made.

The German patent DE 103 216 80 D4 discloses a method for determining the quality of a pellicle on a frame located on a mask for the protection of the structures formed on the mask. The structures are in particular protected against contamination with microscopic particles by the foil. The mask is inserted into the exposure tool together with the pellicle, by sending a beam through the pellicle and the mask the quality of the pellicle or of the foil tightened on the frame, respectively, can be inferred from the resulting diffraction.

The U.S. Pat. No. 5,853,927 discloses a method for aligning a mask in a photolithographic process. The mask carries a frame with a pellicle for the protection of the structures below. Already with the naked eye or by using a microscope a user can identify bad alignment or attachment of the pellicle frame with respect to the mask. For this purpose a number of alignment marks are provided on the mask, by which the alignment or the correct attachment of the pellicle frame with respect to the mask can be checked and corrected, respectively.

The Japanese patent application JP 10073407 discloses a metrology tool also measuring the positions of structures on a mask protected by a pellicle frame with a foil. In the apparatus proposed here, the bending or curvature of the foil or pellicle, respectively, is taken into account in the determination of the positions of the structures on the mask. With the apparatus proposed in the patent application it is possible to determine the curvature of the pellicle tightened in the frame, and to take it into account when measuring the positions of the structures on the mask, if indicated.

The Japanese patent application JP 2005 292197 discloses an apparatus for measuring the position of attachment of the pellicle frame on the mask. The position of the pellicle frame on the mask is determined by a contactless measurement apparatus.

The Japanese patent application JP 4133061 discloses an apparatus for determining the planarity of a photomask. A laser beam is sent through the mask. Behind the mask a mirror is located, so that from resulting interference fringes due to thickness variations of the mask the planarity of the mask can be inferred.

The Japanese patent application JP 5061187 also discloses an apparatus for the inspection of the planarity of a mask provided with a pellicle frame. The surface of the mask is illuminated with a laser beam through the pellicle. The objective and the detection system for the remitted light beam are adjusted in such a way that the light from the position to be detected on the mask reaches a pre-defined position through the pellicle. The height of the position hit by the laser is determined based on the adjusted and measured position. Based on plural measurement points distributed on the surface of the mask, the planarity of the mask eventually can be inferred.

In determining the positions of structures on the surface of a mask with a metrology tool the bending of a mask is taken into account. Up to now it has not been considered that even a pellicle frame attached to the mask and provided with a pellicle affects the bending behaviour of a mask. In measurements up to now the measurement values determined with a metrology tool were only corrected with a theoretical model resulting from the bending of a mask not provided with a pellicle frame. The bending of the mask therein was calculated with a system in which the mask is in contact with three support points. Based on the calculated model the position of structures on the mask measured with the metrology tool were corrected. The measurement of positions of structures on the surface of masks provided with a pellicle frame is of growing importance, as the relevance of overlay between masks is increasing. Attaching the pellicle frame to the completely structured mask leads to an additional stress inside the mask, which, relative to an ideal flat mask effects a position shift of the structure to be measured of about 1 nm to 3 nm. With the present 6-inch standard masks a bending model is used which does not take into account the physical properties and the physical behaviour of a mask with a pellicle frame.

SUMMARY OF THE INVENTION

It is the object of the invention to provide a method for determining the positions of structures on the surface of a mask with a defined reproducibility of the metrology tool, wherein the effect of the pellicle frame on the reproducibility is eliminated.

The object is achieved by a method for the reproducible determination of the positions of structures on a mask, wherein the invention comprises the following steps:

providing a mask with a pellicle frame firmly attached thereto;

calculating a theoretical model for the bending of the mask with the firmly attached pellicle frame, wherein material properties of the mask, of the pellicle frame, and of the attaching means between the pellicle frame and the mask are taken into account in the calculation of the bending of the mask, and wherein for the calculation of the bending of the mask its contact with three support points is considered;

measuring the positions of structures on the mask with a metrology tool; and correcting the measured position of each structure with the theoretical model of the bending of the mask at the respective position of each measured structure.

In the method for the reproducible determination of positions of structures on a mask a theoretical model for the bending of the mask is calculated. A pellicle frame is firmly attached to the mask. The pellicle frame holds a pellicle or foil for the protection of the structures formed on the mask and enclosed by the pellicle frame. The theoretical model for the bending of the mask is calculated in such a way that the influence of the pellicle frame firmly attached to the mask is taken into account. In the calculation of the theoretical model the material properties of the mask, of the pellicle frame and of the attaching means between the pellicle frame and the mask are taken into account. Furthermore the calculation is based on the fact that the mask is in contact with three support points. Eventually the positions of the structures on the mask are measured with the metrology tool. At measurement, illumination and also imaging are done through the pellicle. The measured positions of structures on the mask are corrected with the theoretical model, which takes into account the bending of the mask under the influence of the pellicle frame firmly attached to the mask. The measured structures are corrected at each position of the mask with the respective calculated bending according to the theoretical model.

The material properties of the pellicle frame refer to the height, the outer dimensions, the inner dimensions, the Young modulus, the Poisson ratio, and the density of the material of the pellicle frame. These material properties are taken into account in the calculation of the theoretical model of the bending of the mask.

The attaching means by which the pellicle frame is attached to the mask is an adhesive. The material properties of the adhesive, which are also taken into account in the bending of the mask with consideration of the pellicle frame firmly attached to it, are the height of the adhesive film between the pellicle frame and the mask, the Young modulus, the Poisson ratio, and the density of the adhesive.

In calculating the model for the bending of the mask additional parameters may be assumed constant for all masks, or these parameters can be determined with the metrology tool before each measurement of a mask.

If one assumes that the mask is always placed in an equal manner onto the support points in the metrology tool, the position of the support points can always be assumed constant and need not be determined at each new measurement.

If on the other hand it is assumed that the mask is not always positioned in an identical manner onto the three support points, the position of the three support points relative to the coordinate system of the mask can be found with the metrology tool. The thus found position of the three support points is then taken into account in the calculation of the theoretical model of the bending of the mask. One can proceed analogously with respect to the position of the pellicle frame on the mask. It is obvious to a person skilled in the art that depending on the position of the pellicle frame with respect to the coordinate system of the mask a different influence on the bending of the mask results. As here it can again be assumed that the pellicle frame is always attached to the mask in a constant fashion with constant material properties, it is sufficient to determine this position once and then to calculate a theoretical model for the bending of the mask. This model can then be used for the correction of the positions of structures on the surface of the mask, as measured with the metrology tool, for all masks of at least one batch.

If the position of the pellicle frame relative to the coordinate system of the mask has a substantial effect over the bending of the mask, or if it is not guaranteed that the pellicle frame is always positioned in an equal manner relative to the coordinate system of the mask for a batch of masks, it is advisable to calculate the position of the pellicle frame relative to the coordinate system of the mask for each mask. From the calculation for each mask an individual theoretical model for the bending of the mask together with the pellicle frame results. The pellicle frame exhibits four sides, each of which consists of a pair of edges. The position of the pair of edges is found via two measurement positions, and based on the measurement values found the size of the frame, the centre of the frame relative to the mask, and the orthogonality of the mask can be calculated. All these parameters eventually can be taken into account in the calculation of the theoretical model of the bending of the mask.

It is furthermore advisable to determine the position of the four outer edges of a mask. This is also done with the metrology tool. Based on the measured values found the size of the mask, the centre of the mask and/or the orthogonality of the mask can be calculated.

The position of the pellicle frame relative to a coordinate system of the mask can also be measured with the metrology tool. The position of the edges of the pellicle frame, the position of the three support points and the position of the at least two outer edges of the mask can be found in the micrometer range.

As already mentioned above a theoretical model for the bending of the mask calculated once can be used for all masks of a batch. This, however, requires that some parameters entering the calculation of the bending of the mask do not change or at least lie within a certain range of tolerance. Thus it would be possible to correct all measured values of positions of structures of different masks with a single model for the bending of the mask.

The data for the calculated model of the bending of the mask can be stored in a memory. The measured positions of structures on the mask corrected with the theoretical model of the bending of the mask correspond to the positions that would be obtained from a measurement of a mask with a pellicle frame that is not bent.

As already mentioned, a mask usually exhibits four edges, wherein the position and/or the location in space relative to a coordinate system of one of the edges is determined via two measurement positions. Based on the measured values the size of the mask and/or the centre of the mask are calculated. The pellicle frame also exhibits four sides, each of which consists of an edge pair. The position of the edge pair is also found via two measurement positions. Based on the measured values the size of the frame, the centre of the frame and/or the orthogonality of the frame are calculated. The number of edges to be measured can be decided by the user according to an arbitrary measurement recipe. The number of measured values per edge to be determined can be chosen arbitrarily, too.

The positions of the edges (mask or pellicle frame) are recorded with a camera of the metrology tool. Subsequently the positions of the edges are found by image analysis. A further possibility for the determination of the position of the individual edges is to use a laser autofocus system of the metrology tool for finding the positions of the edges.

BRIEF DESCRIPTION OF THE DRAWINGS

In what follows embodiments shall illustrate the invention and its advantages with reference to the accompanying figures.

DETAILED DESCRIPTION OF THE PREFERRED EMBODIMENTS

Figure 1:
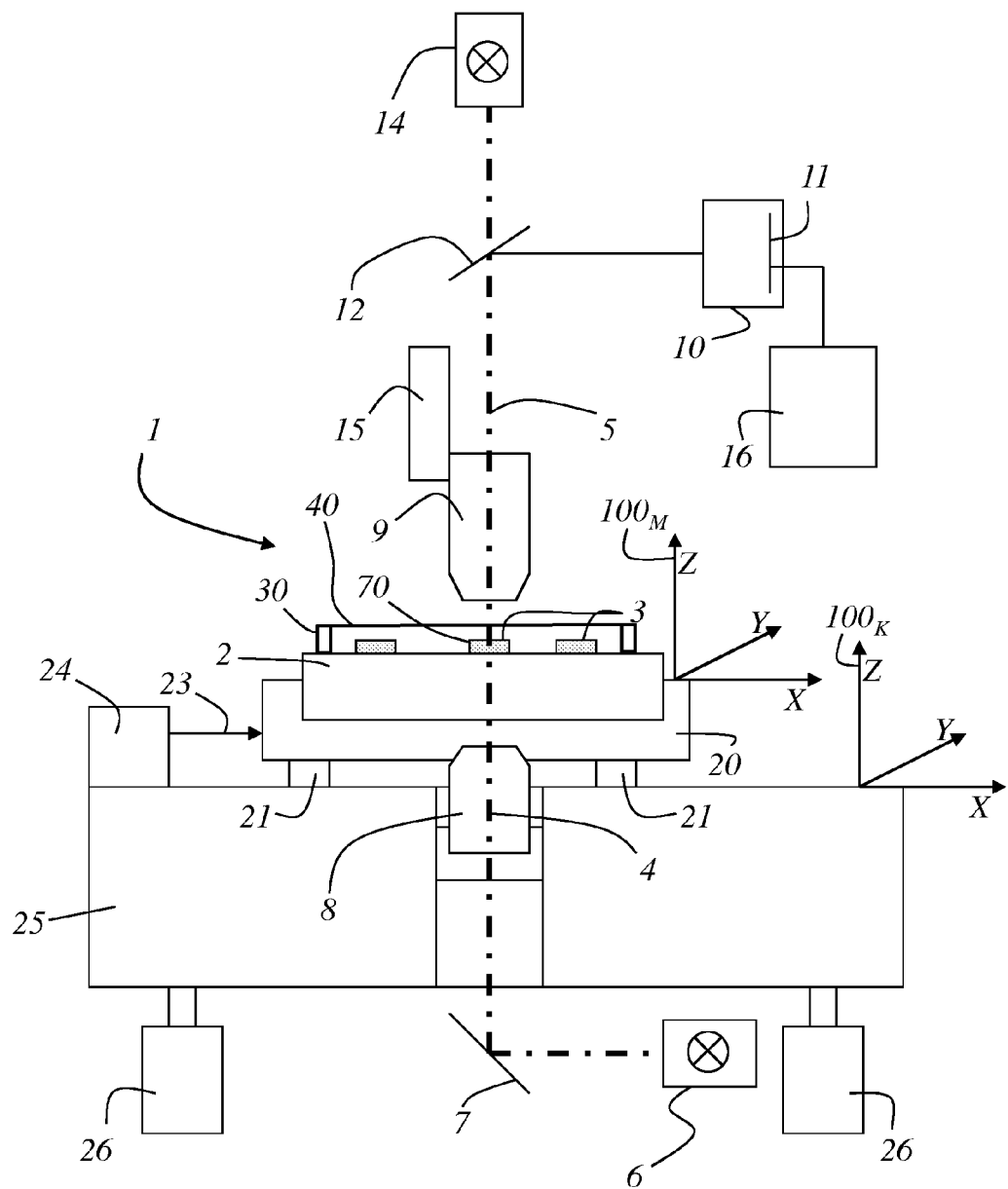
FIG. 1 schematically shows the configuration of a metrology tool for finding the structures, or the positions of the edges of the structures, relative to a coordinate system of the metrology tool.

Identical reference numerals are used for like elements of the invention or elements of like function. Furthermore for the sake of clarity only those reference numerals are shown in the individual figures that are necessary for the description of the respective figure.

The principle of the metrology tool 1 of the type shown in FIG. 1 has been in the state of the art for quite a while. The metrology tool 1 exhibits a granite block 25 supported on vibration dampers 26. The granite block 25 therein is not to be considered a limitation of the invention. It is obvious to a person skilled in the art that instead of a granite block 25 an arbitrary block may be used which at least provides a plane on which a measurement stage 20 can be moved. As already mentioned on the granite block 25 a measurement stage 20 is arranged, which is movable in the X-coordinate direction and in the Y-coordinate direction. The measurement stage 20 is movable in the X-coordinate direction and in the Y-coordinate direction due to corresponding bearings. The bearings 21 preferentially are air bearings. The measurement table advantageously consists of a glass-ceramic material with a small coefficient of thermal expansion. Driving elements for displacing the measurement table 20 are not shown. The position of the measurement stage 20 is measured in the X-coordinate direction and in the Y-coordinate direction with at least one laser interferometer system 24 emitting a measurement light beam 23. The mask 2 to be measured and carrying the structures 3 is placed into the measurement stage 20. The mask 2 for example consists of fused quartz. The main purpose of the metrology tool 1 is to determine an edge 70 of a particular structure 3 relative to the coordinate system 100K of the metrology tool 1. Likewise there is a coordinate system 100M for the mask 2. Both coordinate systems are related, so that the individual measured positions can be transferred into the other coordinate system by corresponding coordinate transformations.

Above the mask 2 there is a measurement objective 9 of high optical quality, which is configured to be displaced along an optical axis in Z-coordinate direction for focusing. The optical axis 5 defines a reference point for the measurement of the position of the edge 70 relative to the coordinate-system 100K of the metrology tool 1. The measurement objective 9 is configured to be displaced in Z-coordinate direction by a displacement unit 15. The light from a top-light source 14 reaches the surface of the mask 2 through the measurement objective 9. In the embodiment shown the mask 2 exhibits a pellicle frame 30 carrying the pellicle 40. By the pellicle 40 the structures 3 on the surface of the mask 2 below are protected against contamination. The light from the top-light source 14 thus also passes through the pellicle 40 during measurement. The light from the mask 2 collected by the measurement objective 9 also passes through the pellicle 40 and via a beam splitter 12 reaches a camera 10. The camera 10 for example is a CCD camera and connected with a computing unit 16. The computing unit 16, apart from evaluating the measurement results, also serves for controlling the metrology tool and for carrying out the individual measurement processes or measurement steps, which are to be performed on the respective mask 2. Additionally the computing unit 16 can be used for calculating a theoretical model of the bending of the mask 2 together with the pellicle frame and to apply it in a corresponding fashion to the measured positions of edges 70 of the structures 3 on the surface of the mask 2. For the determination of the position of the edge 70 of a structure 3 relative to the coordinate-system 100K of the metrology tool 1 a measurement window (not shown here) is defined on the detector 11, within which the structure 3 to be measured is located.

For an optional transmitted light illumination a condenser 8, the Z-position of which is settable, is inserted into the granite block 25. The condenser 8 is associated with a further light source 6. The light source 6 is the transmitted light source and defines a transmitted light beam path 4. The transmitted light beam path 4 is directed onto the condenser 8 by a tilted mirror 7. This configuration of the transmitted light illumination only is one possible embodiment and therefore is not to be taken as a limitation of the invention. It is obvious to a person skilled in the art that the supply of illumination light can be achieved in various ways.

Neither is it shown in FIG. 1 that an input unit or input means may be associated with the metrology tool 1, allowing the user to input parameter values corresponding to the individual measurement procedures or to the individual material properties. The material properties (of the mask, of the pellicle frame and/or of the adhesive with which the pellicle frame is attached to the mask) ultimately serve for the calculation of the theoretical bending of the mask in connection with the pellicle frame. The input values are necessary in order that the measuring process of the mask or the calculation process of the theoretical bending of the mask, respectively, can be done as far as possible automatically by means of a finite-element model.

Figure 2:
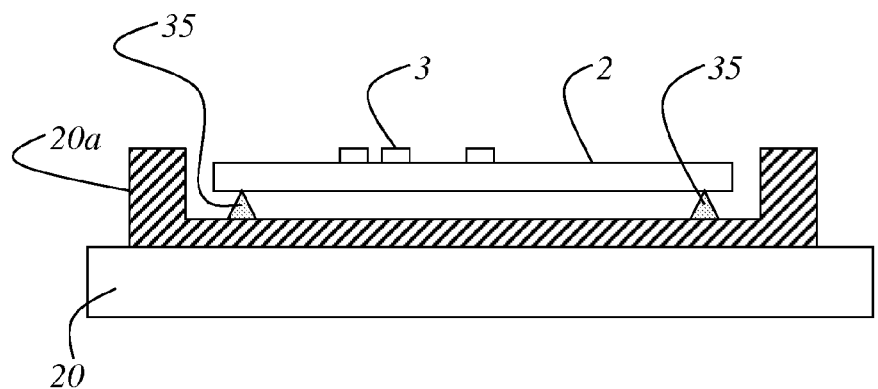
FIG. 2 schematically shows the placement of a mask in a mask holder exhibiting support points for contact with the mask.

FIG. 2 shows a schematic side view of the placement of the mask 2 on the measurement stage 20. The measurement stage 20 further comprises a minor body 20a arranged on the measurement stage 20. The minor body 20a is used for the determination of the position of the measurement stage 20. The measurement beams 23 (see FIG. 1) of the laser interferometer system 24 are directed onto the mirror body 20a so that in this way the position of the measurement stage 20 with respect to the optical axis 5 of the metrology tool 1 can be determined. In the minor body 20a plural holding elements 35 are provided, on which the mask 2 to be measured rests. In the embodiment shown the holding elements 35 are arranged in such a way that they are in contact with that surface of the mask 2 which does not carry structures 3. The holding elements 35 for the mask 2 are of such design that they are in point-like contact with the mask 2. Usually ruby balls are used as holding elements 35, so that the mask 2 is in contact with the ruby balls in one point.

Figure 3:
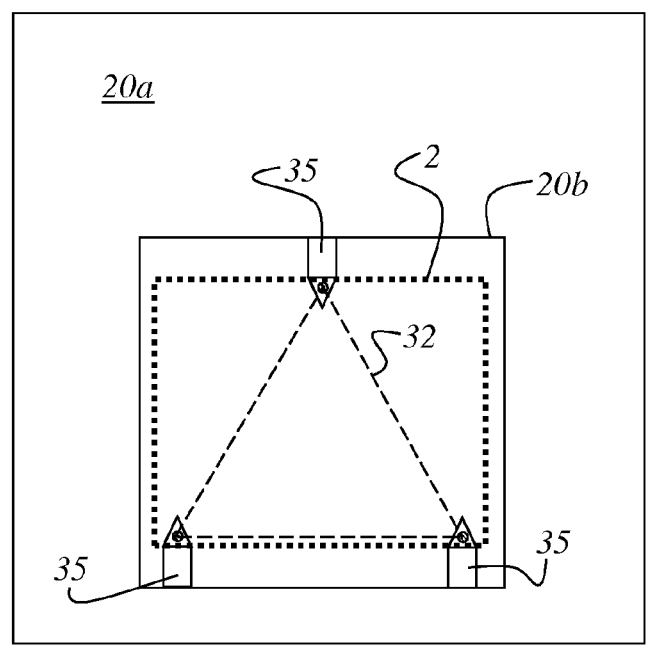
FIG. 3 shows a top view of a mask in a mask holder, wherein the mask is placed onto the three support points in a defined position.

FIG. 3 shows a schematic top view of the mask holder or minor body 20a, respectively, in which the mask 2 is held by three holding elements 35. The holding elements 35 thus constitute the support points for the mask 2. In the embodiment shown the three holding elements are arranged at the corners of a triangle. The mirror body 20a or the mask holder, respectively, exhibits an opening 20b, into which the mask 2 is placed. The position of the holding elements 35 or the position of support is of particular relevance, as their position is also taken into account in the calculation (with the finite-element method) of the bending of the mask 2.

Figure 4:
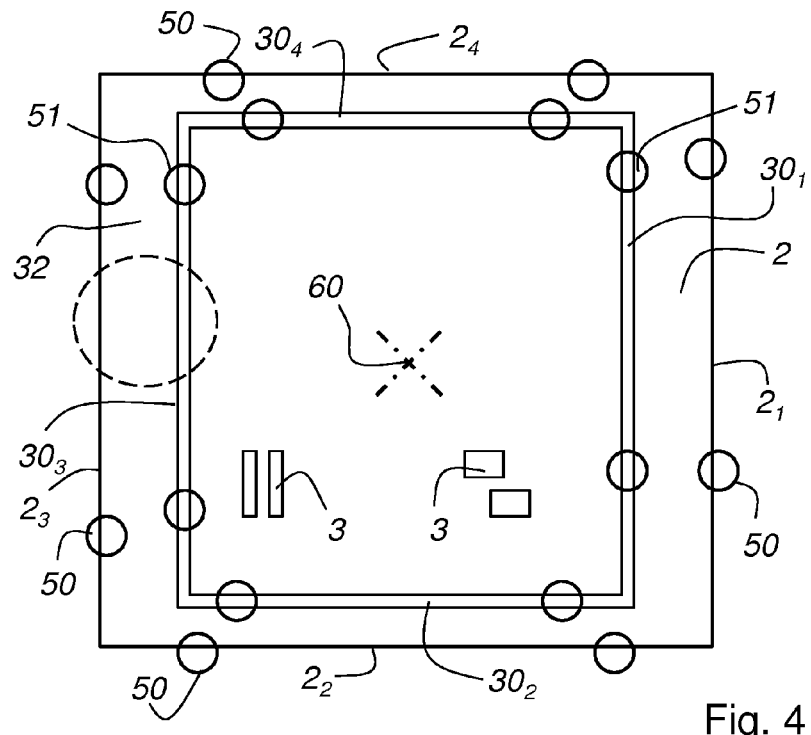
FIG. 4 shows a top view of a mask with a pellicle frame for the protection of the structures on the surface of the mask below. Furthermore a plurality of measurement positions are indicated, through which the positions of the pellicle frame or the position of the mask, respectively, can be measured.

FIG. 4 schematically shows a top view of a mask 2 exhibiting plural diverse elements, the edge positions of which are to be found by the metrology tool 1. The edge positions found in this way in a particular embodiment of the method may enter the calculation of the theoretical bending of the mask 2. On the mask 2 the pellicle frame 30 with the pellicle 40 (see FIG. 5) is situated. In addition the surface 2a of the mask 2 exhibits a plurality of structures 3 to be measured. The mask 2 itself has four outer edges 21, 22, 23, and 24. Also, the plurality of measurement positions 50 by which the position of the edges 21, 22, 23, and 24 of the mask can be found, is shown in FIG. 4. The position of the pellicle frame 30 can be found by further measurement positions 51. The position of the pellicle frame 30 and its shape is defined by the position of the edges 301, 302, 303, and 304. The parameters found in this way also enter the calculation of the theoretical model of the bending of the mask 2. As already mentioned above, the calculation of the model is done by means of the finite-element method. It is obvious for a person skilled in the art that it is not necessary to determine the position of each edge. Also, to each edge 301, 302, 303, and 304 of the pellicle frame 30 there may also be associated two measurement positions 51, which is not to be taken as a limitation of the invention. As the mask 2 and the pellicle frame 30 for the pellicle 40 consist of four edges, the positions of the individual edges are measured with eight measurement positions in each case. Based on the measured position the various geometric parameters of the mask 2 or of the pellicle frame 30, respectively, can be determined.

Figure 5:
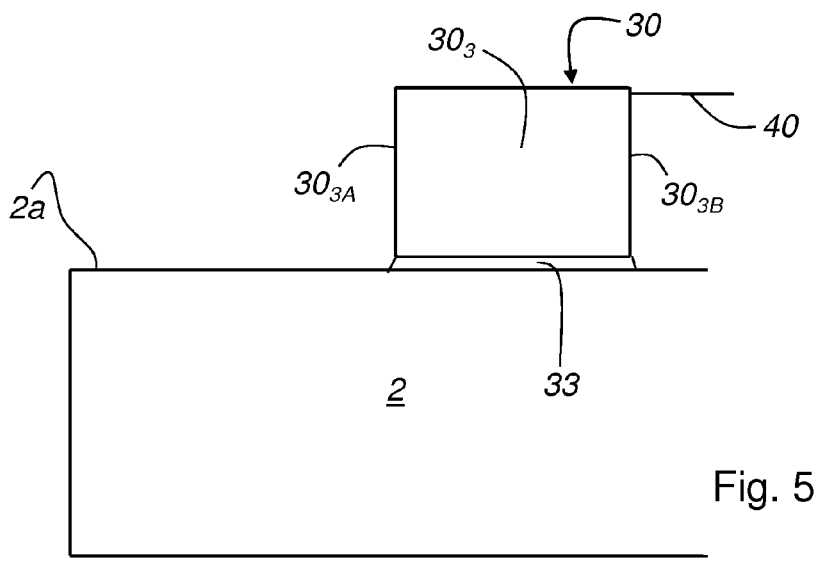
FIG. 5 shows a detailed view (side view) of the area marked with a dashed circle in FIG. 4.

FIG. 5 is a side view of the area marked by the dashed circle in FIG. 4. On the surface 2a of the mask 2 plural elements are provided, each exhibiting edges. For example on the surface 2a of the mask 2 an adhesive layer 33 is provided, by which the mask 2 and the pellicle frame 30 are attached to each other. Likewise on the surface of the mask 2 the pellicle frame 30 for the pellicle 40 is provided. In the representation of FIG. 5 only a part 303 of the pellicle frame 30 is shown. The part 303 of the pellicle frame 30 exhibits an outer edge 303A and an inner edge 303B.

Figure 6:
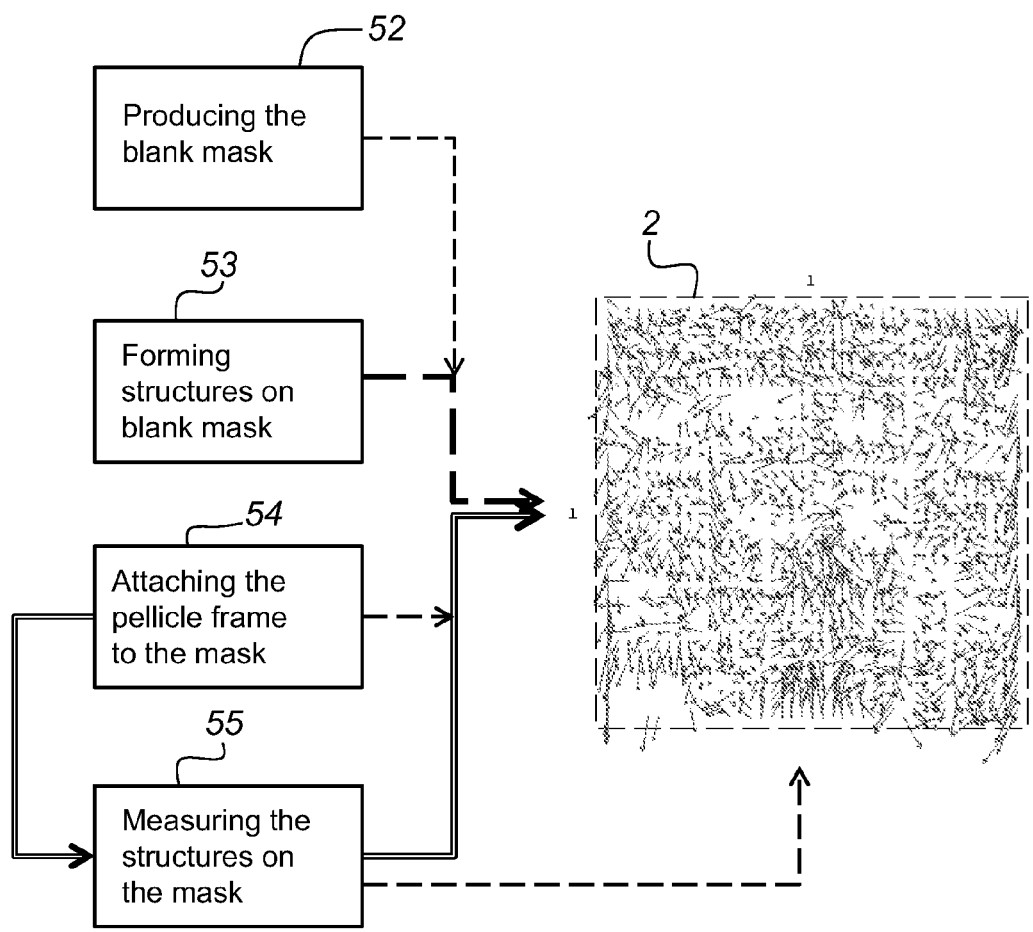
FIG. 6 schematically shows the process of producing a mask and the various errors, which ultimately affect the reproducibility of the measurement of positions of structures on the surface of a mask.

The influence of the various errors on the determination of the position of structures 3 on the surface 2a of a mask 2 is illustrated in FIG. 6. Already during the production of a mask 2 (blank mask) in the step 52 errors can occur, which ultimately affect the reproducibility of the determination of positions of structures on the surface of a mask 2. In the representation of FIG. 6 the errors not caused by the attachment of the pellicle frame 30 are shown dashed. The width of the respective line indicates the weight of the error in the determination of the position of structures 3 of the surface 2 of a mask 2. The entire error regime affects the reproducibility of the measurement with a metrology tool 1. In a further step 53 structures are formed on the blank mask. Errors occurring during the formation of structures also affect the reproducibility of the measurement with a metrology tool 1. After the structures have been formed on the surface of a mask 2, in a further step 54 the pellicle frame 30 is attached on the mask for the protection of these structures. The presence of the pellicle 40 alone has a negative effect on the reproducibility of the measurement, as the pellicle 40 can sag to a various extent and thus can distort the measurement results. A further and noteworthy source of error is the attachment of the pellicle-frame 30 itself, which, as already mentioned above, affects the bending of the mask 2. If a mask 2 with a pellicle frame 30 is measured in step 55, the pellicle frame 30 leads to a different bending of the mask 2 to be measured. This in turn leads to wrong measurement results. Thus it is also easily conceivable that not only the presence of the pellicle frame on the mask, but also the position of the pellicle frame on the mask, affects the bending of the mask. For increasing the reproducibility of a measurement it is therefore of considerable importance to know the parameters (material parameters and position parameters) of the pellicle frame 30, in order to establish an improved correction model for the bending of the mask or a better theoretical model calculation of the bending of the mask taking into account the pellicle frame.

Also shown in FIG. 6 is the reproducibility of the measurement results for a mask 2, wherein the length of the arrows represents the error at the various points of measurement.

Figure 7:
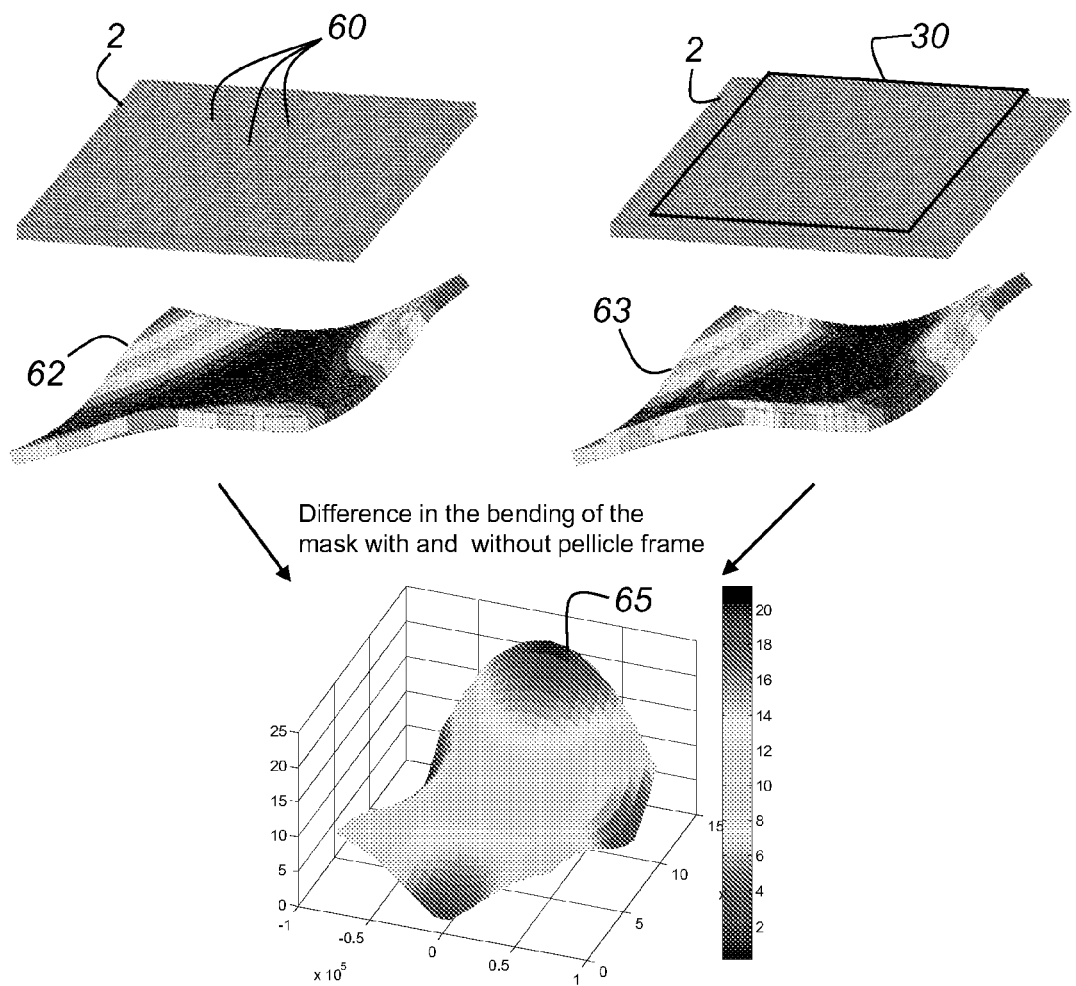
FIG. 7 shows the differences in bending between a mask without a pellicle frame and a mask with a pellicle frame.

FIG. 7 in a schematic representation shows the difference in the bending of the mask 2 with and without pellicle frame 30. The mask without pellicle frame 30 and the mask with pellicle frame 30 are shown as finite element models. The entire mask 2 therein is divided into a plurality of cells 60. The bending 62 of the mask 2 without the pellicle frame 30 is shown directly below the mask 2 without the pellicle frame 30. This bending 62 is calculated by means of a model wherein the mask 2, as already mentioned above, rests on three well-defined support points. On the right side in FIG. 7, below the mask 2 with the pellicle frame 30 the bending 63 of the mask 2 is shown which results from the model calculation taking into account the effect of the pellicle frame 30. The difference 65 in the bending of the mask 2 according to the two models 62 and 63 is indicated in colour. The difference 65 comprises a different height in the direction of the Z-coordinate axis, which results from respectively taking into account or not taking into account the pellicle frame 30 in the calculation of the model of the bending of the mask 2. FIG. 7 thus clearly shows that the pellicle frame 30 surely has an influence on the extent of the bending of a mask 2. This difference, as already mentioned above, ultimately affects the reproducibility of the measurement results obtained with the metrology tool 1.

Figure 8A:
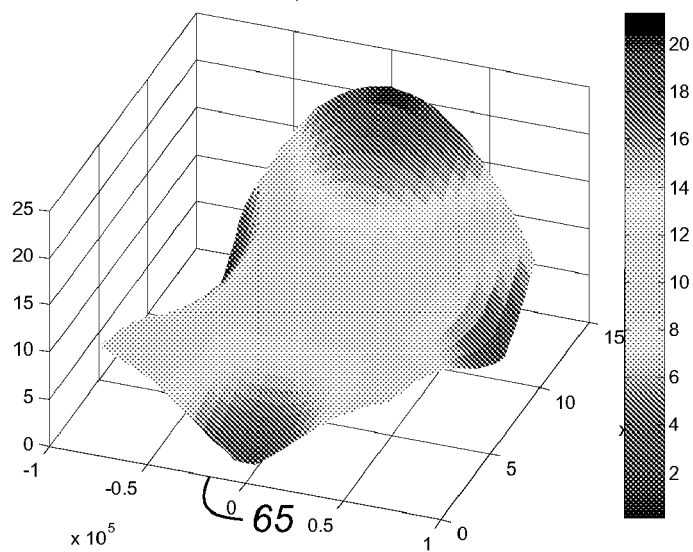
FIG. 8a shows the resulting difference in the direction of the Z-axis due to the different bending of the mask with pellicle frame and without pellicle frame.
Figure 8B:
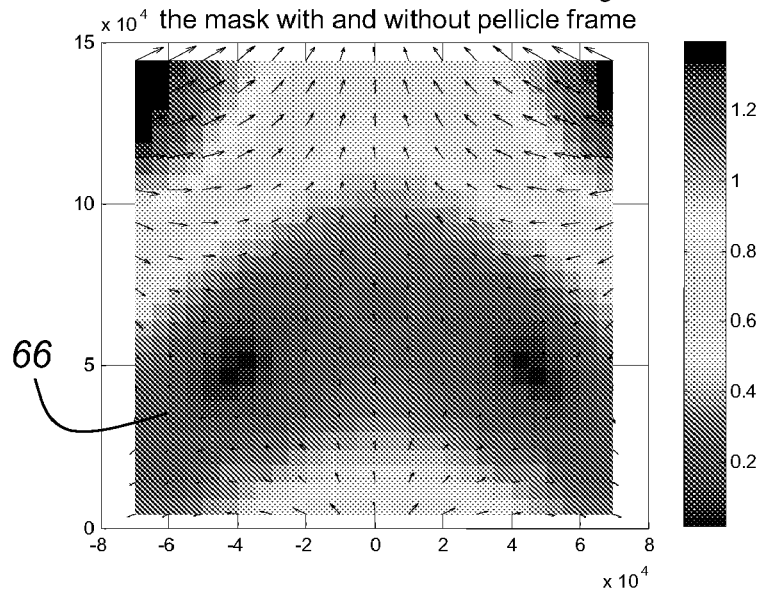
FIG. 8b shows the lateral displacements of the positions of structures on the surface of the mask resulting from the different bending of the masks with or without pellicle frame.

In FIG. 8a the resulting difference in Z-direction is again represented graphically. This difference 65 results from the fact that the two model calculations for the bending of the mask 2 with pellicle frame 30 and of the mask without pellicle frame 30 are different. In figure 8b the effect of the different bending of a mask 2 with pellicle frame 30 and of a mask 2 without pellicle frame 30 on the lateral displacement 66 of the structures 3 is shown. Due to the different Z-position in the calculation of the bending of the mask 2 in dependence on the mask 2 without pellicle frame 30 and on the mask 2 with pellicle frame 30 a different lateral position of the structures results. This obviously adversely affects the reproducibility of the metrology tool 1.

Figure 9:
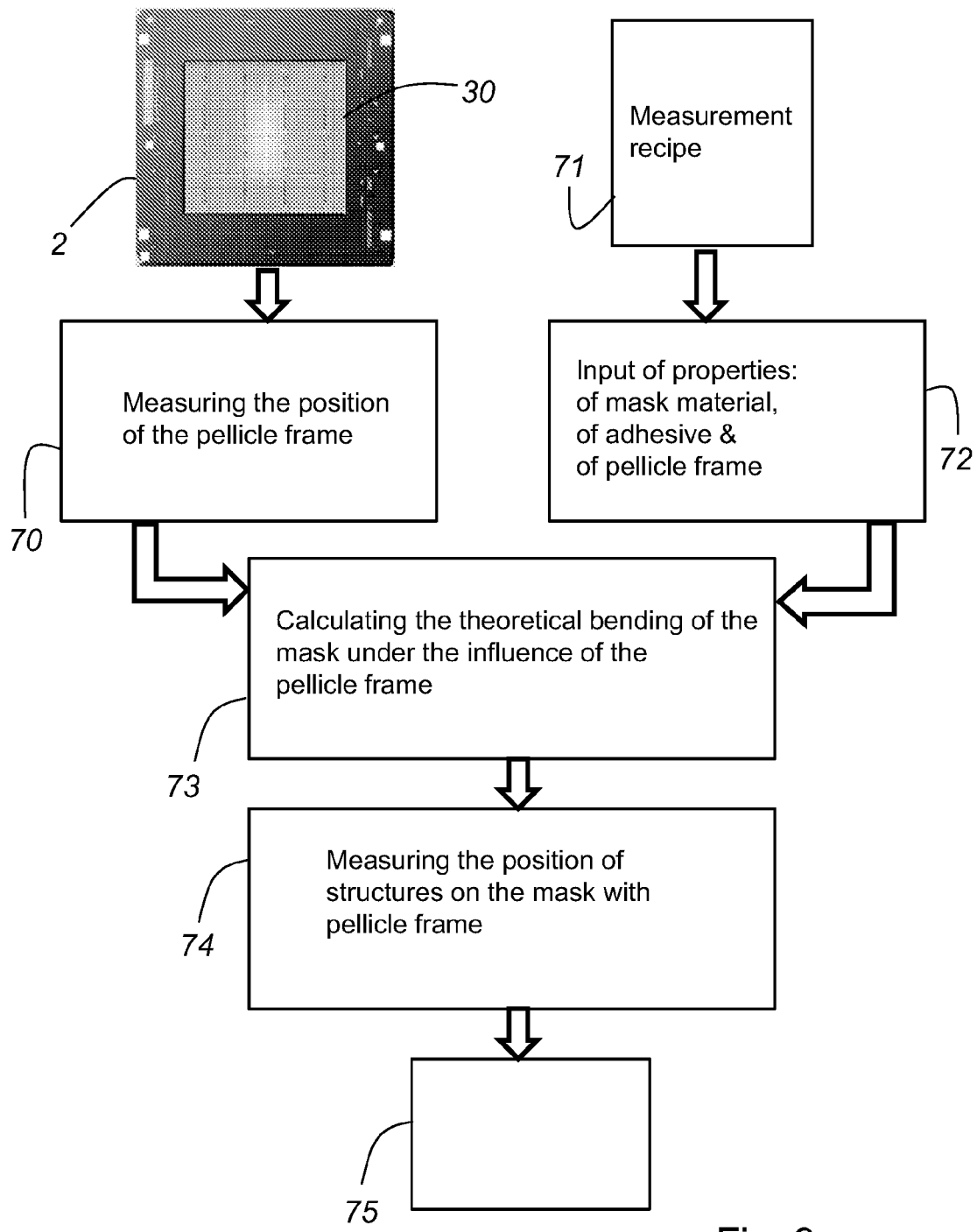
FIG. 9 shows a schematic view of the flow of the method according to the invention.

In FIG. 9 schematically an embodiment of the method according to the invention is shown. The mask 2 is provided with a pellicle frame 30. Also, a pre-defined measurement recipe 71 is assigned to the particular mask 2, in order to determine the various material properties and various measurement protocols and sets of parameters. In a first step 70 the position of the pellicle frame 30 on the mask 2 can be measured with the metrology tool 1. As already mentioned above, the position of the pellicle frame 30 on the mask 2 is decisive for the extent of the bending of the mask 2. In a further step 72 the properties and parameters of the mask 2, of the adhesive 33, and of the pellicle frame 30 are input, which are required for the calculation of the model of the bending of the mask 2. In the embodiment shown eventually the calculation of the bending of the mask 2 is performed in the step 73. Therein the measured position of the pellicle frame 30 is referenced. Also the various required sets of parameters input in step 72 are taken into account in the calculation of the bending. Which parameter sets and whether it is necessary to measure the position of the pellicle frame 30, ultimately depends on how strongly the individual parameters or the position of the pellicle frame 30 on the mask 2 vary between masks 2 of a batch. In a final step 74 the individual positions of the structures 3 on the surface of the mask 2 are measured with the metrology tool 1. The data is stored in a memory 75 of the computer 16 and then can be corrected with the theoretical model of the bending of the mask 2.

The invention has been described with reference to a preferred embodiment. However, it is obvious to a person skilled in the art that alterations and modifications can be made without leaving the scope of the subsequent claims.

What is claimed is:

1. A method for the reproducible determination of the position of structures on a mask, comprising the following steps of:
    providing a mask with a pellicle frame firmly attached thereto;
    calculating a theoretical model for the bending of the mask with the firmly attached pellicle frame, wherein material properties of the mask, of the pellicle frame, and of the attaching means between the pellicle frame and the mask are taken into account in the calculation of the bending of the mask, and wherein for the calculation of the bending of the mask its contact with three support points is considered;
    measuring the positions of structures on the mask with a metrology tool; and
    correcting the measured position of each structure with the theoretical model of the bending of the mask at the respective position of each measured structure, wherein the material properties of the pellicle frame refer to the height, the outside dimensions and the inside dimensions, the Young modulus, the Poisson ratio, and the density of the pellicle frame, which are taken into consideration in the calculation of the theoretical model of the bending of the mask.

2. The method of claim 1, wherein the attaching means between the mask and the frame is an adhesive, and wherein the material properties of the adhesive refer to the height of the adhesive film between the pellicle frame and the mask, the Young modulus, the Poisson ratio and the density of the adhesive, which are taken into consideration in the calculation of the theoretical model of the bending of the mask.

3. The method of claim 1, wherein the position of the three support points of the mask relative to the coordinate system of the mask are found with the metrology tool, and wherein the positions of the three support points are taken into consideration in the calculation of the theoretical model of the bending of the mask.

4. The method of claim 1, wherein the pellicle frame comprises four sides, each of which consisting of an edge pair, wherein the position of the edge pair is determined by two measurement positions, and wherein, based on the measurement values obtained, the size of the frame, the center of the frame and or the orthogonality of the frame are calculated.

5. The method of claim 1, wherein the mask comprises four outer edges, and wherein the positions of at least two of the outer edges are found with the metrology tool, and wherein, based on the measurement values obtained, the size of the mask, the center of the mask and/or the orthogonality of the mask are calculated.

6. The method of claim 1, wherein the position of the pellicle frame relative to a coordinate system of the mask is measured with the metrology tool.

7. The method of claim 1, wherein a position of the edges of the pellicle frame, positions of the three support points, and a position of the at least two outer edges of the mask are found in the μm-range.

8. The method of claim 1, wherein a theoretical model of the bending of the mask of a batch of masks calculated once is applied to all masks of this batch, if the material properties of the mask, of the pellicle frame, and of the attaching means, as well as the precision of positioning of the mask on the support points of a measurement stage of the metrology tool each lie within a respectively pre-defined range of tolerance.

9. The method of claim 8, wherein the data of the calculated theoretical model of the bending of the mask is stored in a memory, and wherein the measured positions of the structures on the mask corrected with the theoretical model for the bending of the mask correspond to the positions obtained when measuring a mask with a pellicle frame which is not bent.

* * * * *